United States Patent [19]

Kerlin

[11] 4,273,608
[45] Jun. 16, 1981

[54] METHOD OF FORMING A SHEET OF SINGLE CRYSTAL SEMICONDUCTOR MATERIAL

[76] Inventor: Allen L. Kerlin, 1009 Adrienne Dr., Alamo, Calif. 94507

[21] Appl. No.: 990

[22] Filed: Jan. 4, 1979

[51] Int. Cl.³ .................. C30B 11/08; C30B 29/00
[52] U.S. Cl. .................. 156/605; 156/616 R; 156/DIG. 88; 422/246
[58] Field of Search .............. 156/605, 616 R, 617 H, 156/DIG. 88, DIG. 64; 422/245, 246, 248; 425/115, 435; 264/267–270, 310, 311

[56] References Cited

U.S. PATENT DOCUMENTS

| 2,675,303 | 4/1954 | Sobek et al. | 422/245 |
| 2,826,869 | 3/1958 | Lerch | 425/435 |
| 2,967,095 | 1/1961 | Herrick | 156/DIG. 88 |
| 2,972,524 | 2/1961 | Ross | 422/245 |
| 3,183,554 | 5/1965 | Brandt | 425/435 |
| 3,197,827 | 8/1965 | Haughton et al. | 425/435 |
| 3,914,105 | 10/1975 | Pivar | 425/435 |
| 3,944,393 | 3/1976 | Schierding et al. | 422/246 |

Primary Examiner—Tim R. Miles
Assistant Examiner—Gregory N. Clements
Attorney, Agent, or Firm—Flehr, Hohbach, Test

[57] ABSTRACT

Apparatus for forming thin layers of material such as single crystalline silicon includes a container having a generally cylindrical interior surface. The container is rotatably mounted and movable through a heater. In forming the layer of material, the material is heated in the container to a temperature above the material melting point. The container is rotated whereby the liquid material adheres to the interior surface of the container by centrifugal force. The container is slowly cooled beginning at one end thereof whereby the layer of material solidifies.

11 Claims, 3 Drawing Figures

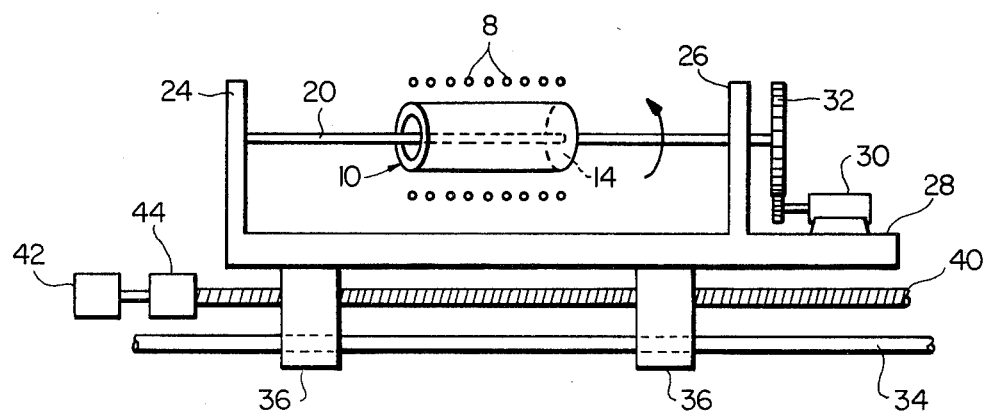
FIG_1
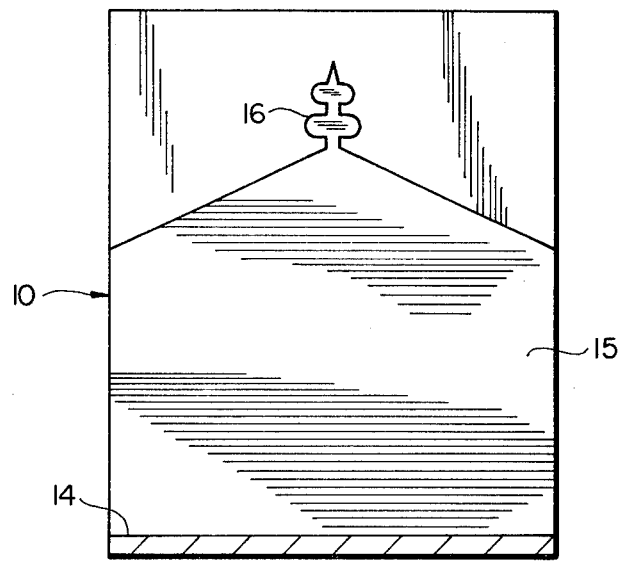
FIG_2
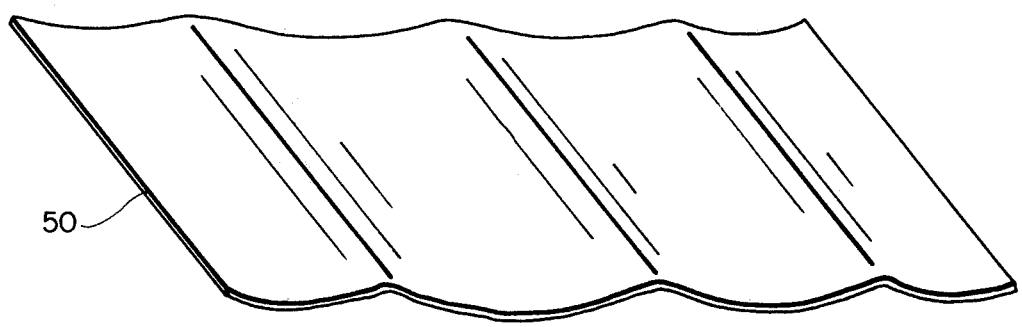
FIG_3

METHOD OF FORMING A SHEET OF SINGLE CRYSTAL SEMICONDUCTOR MATERIAL

This invention relates generally to material processing, and more particularly the invention relates to apparatus for and the method of forming thin layers of material such as semiconductor material.

Much attention is being directed to harnessing solar energy, particularly in the conversion of solar energy to electrical energy by photovoltaic means. The usual silicon cell is a PN-junction semiconductor photovoltaic device which has found particular utility in space applications.

Due to the relatively low efficiency of the silicon solar cell and the expense of single-crystal silicon wafers from which such cells are typically fabricated, electrical energy from such devices is too expensive for most applications.

Efforts at reducing the cost of electrical energy from silicon cells have focused on the fabrication of the silicon material. Alternatives to the growing of ingots from which the wafers are sliced include the growth of single crystal ribbons and the formation of dendrite webs.

Mobil Tyco Solar Energy Corporation has performed much work in growing single crystal silicon ribbons. This process is called edge-defined, film-fed growth (EFG). In the EFG process, capillary action causes molten silicon to rise inside the narrow channel of a die. A silicon ribbon "seed" is then brought into contact with the liquid at the top of the die, and the temperature is adjusted so that ribbon from within the die begins to solidify on the seed ribbon. As the seed is pulled upward, a crystalline ribbon grows downward so that the interface between the melt and the crystal stays just above the die. The dimensions at the top of the die determine the shape of the ribbon.

In the dendritic web process the web portion of a crystal is initially a film of liquid silicon bounded by a crystal button and supporting dendrites. As this film freezes, the web and dendrites form an essentially single crystal sheet.

In both processes great care must be taken in pulling the thin ribbons of silicon to prevent fracture of the solidified silicon.

Among other approaches at forming lower cost silicon substrates for photovoltaic cells there is chemical vapor deposition including the vapor deposition of silicon on a liquid tin layer on a graphite substrate to form polycrystalline films.

An object of the present invention is an improved method of forming thin layers of material.

Another object of the invention is a method for economically forming a sheet of semiconductor material including single crystal and large grain polycrystalline semiconductor material.

Yet another object of the invention is apparatus for forming thin layers of material including single crystal and large grain polycrystalline semiconductor material.

In accordance with the invention, a container is provided which has a generally cylindrical interior surface. Means is provided for rotating the container about the axis of the generally cylindrical interior surface, and heater means is provided for heating the container. Means is provided for moving the container with respect to the heater means whereby the container can be incrementally cooled.

In forming a sheet of material with the apparatus, the material is placed in the container, and the container is rotated and heated above the melting point of the material whereby a liquid layer of the material forms on the interior surface of the container. The rotating container is slowly cooled beginning at one end thereof whereby the material solidifies as a thin layer confined by the interior surface. The interior surface may include a confined area for retaining the melted material.

Advantageously, the confined area can include a neck portion at the initially cooled end of the container for effecting single crystal material growth.

A second material heavier than the first material may be added to the container with the temperature of the container raised above the melting point of both the first and the second materials, whereby the layer of first material forms on the second material.

The invention and objects and features thereof will be more readily apparent from the following detailed description and appended claims when taken with the drawings.

FIG. 1 illustrates one embodiment of apparatus for carrying out the method of material formation in accordance with the invention.

FIG. 2 is a plan view of the interior surface of the container and the apparatus of FIG. 1.

FIG. 3 is a perspective view of a sheet of material formed in accordance with the invention.

FIG. 1 illustrates one embodiment of apparatus for forming thin layers of material in accordance with the invention. The apparatus includes a container 10 having a generally cylindrical shaped interior surface which is positioned within a suitable furnace such as an R. F. furnace having coils 8 (in section). The R. F. heater is open at either end whereby the container 10 can be moved through the coils 8. Since in the formation of semiconductor layers, such as silicon layers, the container will be exposed to temperatures in excess of 1400° C. the container preferably is made of a refractory material such as graphite. The interior surface of container 10 may have an elevated portion 13 and a closed end 14 so that the liquid material is confined within the container. As will be described further hereinbelow, the confined surface portion of container 10 includes a neck portion for effecting single crystalline material growth.

Container 10 is rotatably supported by means of member 20 which is attached to container 10 at the closed end 14 and is rotatably mounted in supports 24 and 26, respectively. Member 20 extends through support 26 and is rotated by motor 30 through a suitable gear train 32.

Supports 24 and 26 are mounted on base plate 28. Base plate 28 is slidably mounted on guide rods 34 by means of bushings or bearings 36. Support 28 is linearly moveable along guide rods 34 by means of drive screw 40 which is driven by drive motor 42 through suitable gear train 44.

Thus, container 10 can be rotated by means of motor 30 and linearly driven through the RF heater by means of drive motor 42.

FIG. 2 is a plan view of the interior surface of container 10 of FIG. 1 with the container unrolled for illustration purposes. The surface includes a confined portion 15 including neck portion 16 which accommodates the liquid material as the container is rotated within the RF heater coils 8. The confined portion may be defined by recessing the interior surface or by forming a raised border around the confined portion for retention of liquid material. Further, the angle and other dimensions of the neck portion and of the remainder of the confined surface portion are for illustration only and can be varied to achieve desired crystal growth and accommodate the film thickness. Typically, the confined portion has a depth on the order of one millimeter. By slowing cooling the container beginning at the end including neck 16, single crystal growth of the solidified material is effected as the solidification emerges from the neck portion. This process is commonly referred to as directional freezing. A similar process is employed in the Bridgeman technique which is well known for single crystal growth. However, in the Bridgeman technique the neck portion is formed at one end of a container and a solid ingot is formed by cooling the melted material beginning at the neck portion. The Bridgeman process is three dimensional in forming a single crystal ingot, whereas the present invention relates to a quasi two dimensional process leading to a single crystal sheet.

In forming a thin layer of material such as silicon using the apparatus illustrated in FIG. 1, silicon material is placed in container 10 and heated above 1410° C. (the melting point of silicon), with the container rotating at several hundred revolutions per minute (for a ten centimeter diameter container) whereby the liquid silicon covers the generally cylindrical interior surface of the container due to centrifugal force. The silicon material can be pre-doped, for example with boron or phosphorous, to have properties which are necessary for solar cell applications or for other device applications. Container 10 is slowly removed from the furnace with the molten silicon solidifying beginning at the neck portion 16 whereby a single crystal structure emerges from the neck portion. By slowly removing the container from the furnace (e.g. 1 cm per minute) the single crystal growth can be maintained as the liquid material solidifies.

The thickness of the formed layer can be controlled by proper combination of amount of material placed in the cylinder and the rotation speed of the cylinder. Thus, the prominent force on the film is governed by rotation speed, i.e. centrifugal force, and not surface tension or gravity. In addition, the rotation increases the uniformity of the temperature gradient of the material which is necessary for proper crystal growth.

In the formation of single crystal silicon, a second material with a higher density than silicon is preferably placed in the furnace, also. The second material may be an immiscible material such as lead. Besides decreasing contamination, the second material (liquid at the silicon crystal solidification temperatures and upon which the silicon floats) provides a very high mobility surface for the silicon nuclei which enhances single crystal growth. The melting point of the second material must be less than the melting point of the first material whereby the first material solidifies on a liquid film of second material.

Assuming the formation of single crystalline silicon on lead, the two materials may be added to the furnace in solid form prior to heating. Alternatively, either or both materials can be added in liquid form through the open end of the heated container.

If improved single crystal structure is desired after formation of the solidified thin layer of material, zone melting processing thereof can be effected by means of heater 48 for heating a confined, annular zone of the material. The heater is slowly moved along the length of the layer of material as the container is rotated causing a molten zone to move along the length of the material, as in conventional zone melting of semiconductor ingots. The sharper heating gradient produced by the heater can enhance the crystalline structure by minimizing spurious crystal growth, as is effected in the conventional zone melting crystal growing technique for semiconductor ingots.

After formation of the thin layer of material, the layer is scribed at the neck end and axially along the layer, and the material is then removed by means of a vacuum chuck. The layer may then be unfolded to form a generally planar sheet of material 50 as illustrated in FIG. 3.

The resulting sheet size, depending on container dimensions, can be quite large thus avoiding the present practice of assembling many small cells to make a photovoltaic array. Further, the time required to produce the sheets compared to the time required in present commercial techniques is low with minimum use of heating power. The process can be employed to form layers of other semiconductor materials as well as other metallic elements and compounds.

Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. The method of forming a sheet of crystalline semiconductor material comprising the steps of
   providing a rotatable container having a generally cylindrical interior surface,
   placing material in said container,
   spinning and heating said container at a temperature above the melting point of said material whereby all material is liquid, and
   slowly cooling said container beginning at one end thereof whereby said material solidifies directionally as a thin layer confined by said interior surface.

2. The method as defined by claim 1, wherein said semiconductor material is silicon.

3. The method as defined by claim 1, wherein a second material heavier than the first material and with a melting point below that of said first material is added to said container, and cooling said container to a temperature above the melting point of said second material and below the melting point of said first material, whereby said layer of first material floats and forms on said second material.

4. The method as defined by claim 1 wherein said interior surface of said container includes a confined portion for retaining the melted material.

5. The method as defined by claim 4 wherein said confined portion includes a neck portion for effecting single crystal growth of said crystalline semiconductor material by cooling said neck portion initially.

6. The method as defined by claim 1, wherein said interior surface of said container includes a confined neck portion for effecting single crystalline material growth as said container is cooled.

7. The method as defined by claim 1 and further including the steps of zone melting processing said thin layer of material.

8. The method as defined by claim 7 wherein said step of floating zone processing includes the step of heating said thin layer by electron beam means.

9. Apparatus for forming thin sheets of crystalline semiconductor material comprising
a container having a generally cylindrical interior surface, said interior surface including a confined area for retaining the material with a neck portion means for effecting single crystal growth,
means for rotating said container about the axis of said generally cylindrical interior surface,
heater means for heating all of said container, and
means for incrementally cooling said container from one end of said container to the other end of said container.

10. Apparatus as defined by claim 9 and further including second heater means for zone melting processing of said crystalline semiconductor material.

11. Apparatus as defined by claim 9 wherein said means for incrementally cooling includes means for moving said container with respect to said heater means.

* * * * *

UNITED STATES PATENT AND TRADEMARK OFFICE
CERTIFICATE OF CORRECTION

PATENT NO. : 4,273,608
DATED : June 16, 1981
INVENTOR(S) : Allen L. Kerlin

It is certified that error appears in the above—identified patent and that said Letters Patent is hereby corrected as shown below:

In the drawings, Sheet 1, Figure 1, should appear as shown below.

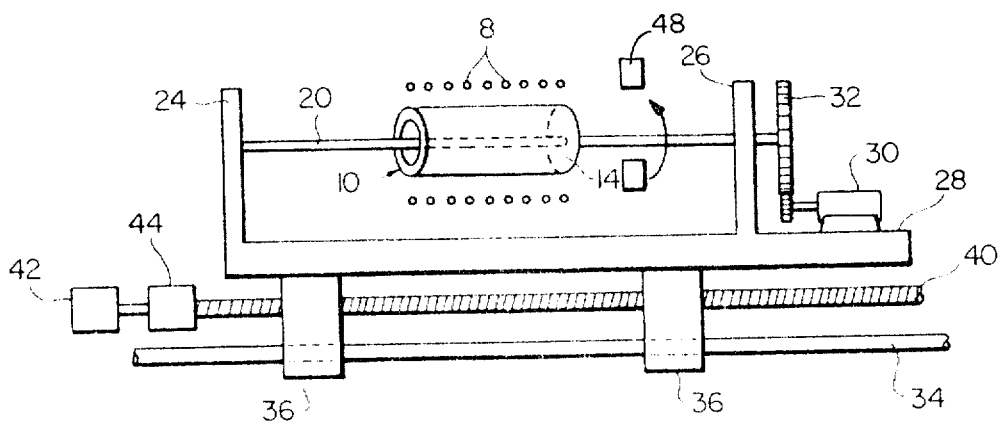

FIG—1

Signed and Sealed this

Fifteenth Day of September 1981

[SEAL]

Attest:

GERALD J. MOSSINGHOFF

Attesting Officer     Commissioner of Patents and Trademarks

UNITED STATES PATENT AND TRADEMARK OFFICE
CERTIFICATE OF CORRECTION

PATENT NO. : 4,273,608

DATED : June 16, 1981

INVENTOR(S) : Allen L. Kerlin

It is certified that error appears in the above-identified patent and that said Letters Patent are hereby corrected as shown below:

Col. 3, lines 12, 13 and 16, "Bridgeman" should be --Bridgman--.

IN THE CLAIMS:

Claim 8, line 2, "floating zone" should be --zone melting--.

Fig. 2 should appear as shown on the attached sheet.

Signed and Sealed this

Fifteenth Day of June 1982

[SEAL]

Attest:

Attesting Officer

GERALD J. MOSSINGHOFF

Commissioner of Patents and Trademarks

UNITED STATES PATENT AND TRADEMARK OFFICE
CERTIFICATE OF CORRECTION

PATENT NO. : 4,273,608  
DATED : June 16, 1981  
INVENTOR(S) : Allen L. Kerlin

Page 2 of 2

It is certified that error appears in the above—identified patent and that said Letters Patent is hereby corrected as shown below:

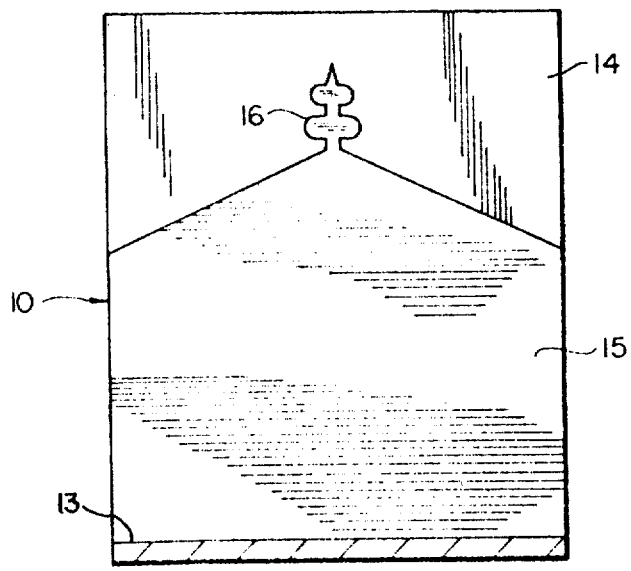

FIG_2